(12) United States Patent
Van Stijn et al.

(10) Patent No.: US 9,097,397 B2
(45) Date of Patent: Aug. 4, 2015

(54) LIGHT SOURCE USING REMOTE PHOSPHOR AND PINK LED

(71) Applicant: KONINKLIJKE PHILIPS N.V., Eindhoven (NL)

(72) Inventors: Patrick Henricus Johannes Van Stijn, Eindhoven (NL); Martinus Petrus Joseph Peeters, Weert (NL); Hans-Helmut Bechtel, Roetgen (NL); Matthias Heidemann, Alsdorf (DE); Jordy Bernard Margreth Schoenmaekers, Ubachsberg (NL); Peter Josef Schmidt, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/366,933

(22) PCT Filed: Dec. 17, 2012

(86) PCT No.: PCT/IB2012/057362
§ 371 (c)(1),
(2) Date: Jun. 19, 2014

(87) PCT Pub. No.: WO2013/093750
PCT Pub. Date: Jun. 27, 2013

(65) Prior Publication Data
US 2014/0355242 A1 Dec. 4, 2014

Related U.S. Application Data

(60) Provisional application No. 61/577,347, filed on Dec. 19, 2011.

(51) Int. Cl.
*F21K 99/00* (2010.01)
*H01L 33/50* (2010.01)

(52) U.S. Cl.
CPC ............... *F21K 9/56* (2013.01); *H01L 33/504* (2013.01); *H01L 33/507* (2013.01)

(58) Field of Classification Search
USPC .......................................... 362/84
See application file for complete search history.

(56) References Cited

U.S. PATENT DOCUMENTS 7,147,803 B2   12/2006   Wang et al.
7,655,156 B2    2/2010   Cheng et al.
(Continued)

FOREIGN PATENT DOCUMENTS

CN    201374346 Y   12/2009
DE     10233050 A1   2/2004
(Continued)

*Primary Examiner* — Laura Tso
(74) *Attorney, Agent, or Firm* — Yuliya Mathis

(57) ABSTRACT

The invention provides a lighting unit (100) comprising a light source (10) and a light conversion layer (20). The light source (10) comprises a light emitting diode (LED) (110) and a first luminescent material layer (120) in physical contact with a light emitting surface (115) of the LED (110). The first luminescent material layer (120) comprises a first luminescent material (130), configured to convert at least part of LED light (111) into light (131) having a red component. The light source (10) is configured to generate light (11) having a blue component and having the red component of the light (131). The light conversion layer (20), configured at a non-zero distance (d) from the light source (10), comprises a second luminescent material (30) configured to convert at least part of the light (11) into light (31). The lighting unit (100) is configured to provide white lighting unit light (111).

15 Claims, 3 Drawing Sheets

(56) References Cited

U.S. PATENT DOCUMENTS

| | | |
|---|---|---|
| 7,713,442 B2 | 5/2010 | Tian et al. |
| 7,723,744 B2 | 5/2010 | Gillies et al. |
| 7,733,002 B2 | 6/2010 | Murazaki |
| 2008/0017875 A1 | 1/2008 | Lee et al. |
| 2010/0025700 A1 | 2/2010 | Jung et al. |
| 2010/0219428 A1 | 9/2010 | Jung et al. |
| 2011/0121331 A1 | 5/2011 | Simonian et al. |
| 2011/0216522 A1* | 9/2011 | Harbers et al. .................. 362/84 |
| 2011/0273079 A1 | 11/2011 | Pickard et al. |

FOREIGN PATENT DOCUMENTS

| | | |
|---|---|---|
| EP | 2104149 A1 | 9/2009 |
| KR | 2004000090 A | 1/2004 |
| WO | 2010106504 A1 | 9/2010 |

* cited by examiner

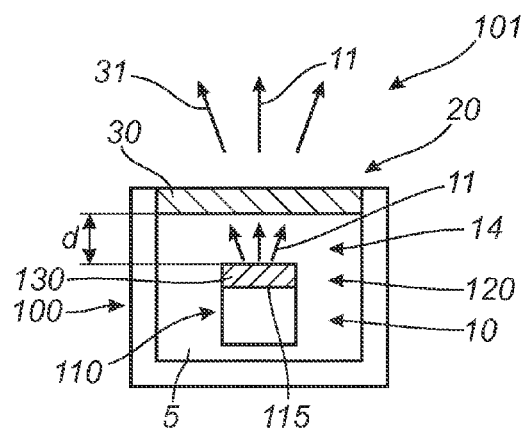
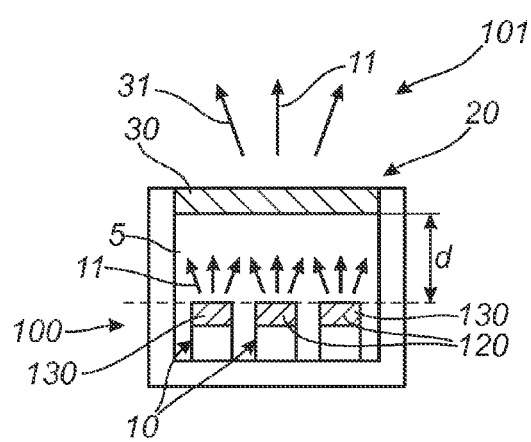
FIG. 1A    FIG. 1B
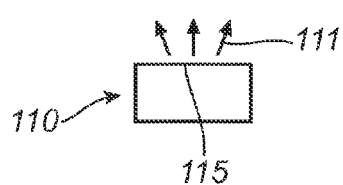
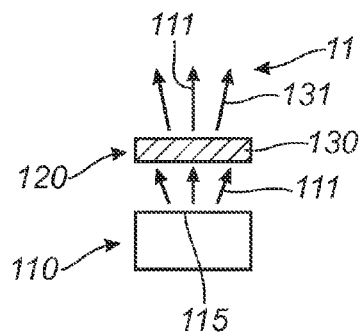
FIG. 2A    FIG. 2B
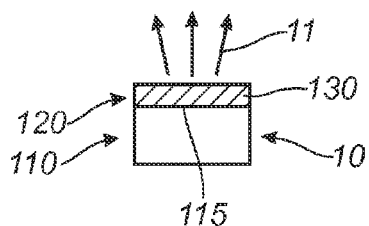
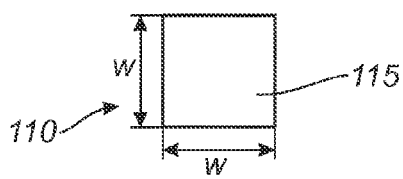
FIG. 2C    FIG. 2D

LIGHT SOURCE USING REMOTE PHOSPHOR AND PINK LED

CROSS-REFERENCE TO PRIOR APPLICATIONS

This application is the U.S. National Phase application under 35 U.S.C. §371 of International Application No. PCT/IB12/057362, filed on Dec. 17, 2012, which claims the benefit of [e.g., U.S. Provisional Patent Application No. or European Patent Application No.] 61/577347, filed on Dec. 19, 2011. These applications are hereby incorporated by reference herein.

FIELD OF THE INVENTION

The invention relates to a lighting unit comprising a light source and a light conversion layer, wherein the light conversion layer is remote from the light source.

BACKGROUND OF THE INVENTION

Lighting units with light conversion layers remote from the light source are known in the art. WO2010/106504, for instance, describes an illumination device comprising a light source and a transmissive arrangement. The light source is arranged to generate light source light and comprises a light emitting device (LED), arranged to generate LED light and a carrier comprising a first luminescent material. The carrier is in contact with the LED and the first luminescent material is arranged to convert at least part of the LED light into first luminescent material light. The transmissive arrangement of a second luminescent material is arranged remote from the light source and is arranged to convert at least part of the LED light or at least part of the first luminescent material light and/or at least part of the LED light. WO2010/106504 indicates to overcome limitations of remote luminescent material systems in spot lighting. In addition, it describes an way of realizing light sources with various correlated color temperatures being allowed, based on just a single type of white (or whitish) light source in combination with various (red-or-ange) remote luminescent materials.

SUMMARY OF THE INVENTION

It is a desire to increase the efficiency of LED based lighting units with luminescent materials that convert at least part of the LED light. It appears that prior art systems may have a sub-optimal efficiency and/or use the luminescent material in a sub-optimal way. Hence, it is an aspect of the invention to provide an alternative lighting unit, which preferably further at least partly obviate one or more of the above-described drawbacks and preferably has an improved efficiency.

The invention provides in a first aspect a lighting unit comprising a light source and a light conversion layer, wherein the light source comprises a light emitting diode (LED) and a first luminescent material layer in physical contact with a light emitting surface of the light emitting diode, wherein the light emitting diode is configured to generate LED light, wherein the first luminescent material layer comprises a first luminescent material, configured to convert at least part of the LED light into luminescent material light having a red component, and wherein the light source is configured to generate light source light having a blue component and having the red component of the luminescent material light (i.e. pink light);

the light conversion layer comprises a second luminescent material configured to convert at least part of the light source light into second luminescent material light, wherein the light conversion layer is configured at a non-zero (geometrical) distance from the light source; and wherein the lighting unit is configured to provide white lighting unit light having the blue and the red component of the light source light and having a complementary color component of the second luminescent material light.

It surprisingly appears that such lighting unit may have a better conversion efficiency than other configurations, such as with one or more of the other luminescent materials on the exit surface of the light source or all luminescent material on the light source. It also appears that luminescent materials may be applied that convert in a more efficient way the light source light than with other configurations.

The term light source may in principle relate to any light source known in the art, but especially refers to a LED-based light source, herein further indicated as LED. The description below will—for the sake of understanding—only address LED-based light sources. The light source is configured to provide pink light, i.e. a combination of blue light (blue component) and red light (red component). This can be obtained in several ways.

In a preferred embodiment, the light emitting diode is configured to generate LED light with a blue component. In other words, the light source comprises a blue LED. At least part of the blue component (or in an embodiment the entire blue component) is in this embodiment provided by the LED.

In general, in this embodiment the luminescent material in the first luminescent material layer and in the light conversion layer will absorb (part of) the blue light and convert at least part thereof into light having another color, and which can at least partly be used as complementary color components to blue. For instance, the LED provides blue light. Part of it is absorbed by the first luminescent material and converted into red light. In this way, the light source provides pink light. The light conversion layer may also convert part of the blue light and convert it into light having a color complementary to blue and red, for instance green and/or yellow light. Further, the light conversion layer is especially configured to transmit part of the light source light, i.e. at least part of the blue light and part of the red light. In this way, white lighting unit light may be obtained.

In yet another embodiment, the light emitting diode is configured to generate LED light with a UV component. The first luminescent material may then be configured to convert at least part of the LED light into luminescent material light additionally having (at least part of) the blue component (in addition to the red component).

In general, in this embodiment the luminescent material in the first luminescent material layer will absorb the UV light and convert at least part thereof into light having a blue color. The first luminescent material layer also comprises a luminescent material that is configured to provide red light. This may be generated upon excitation with the UV light of the LED and/or upon excitation by the blue light. In this way, the light source provides pink light. The light conversion layer may convert remaining UV (if any) and/or part of the blue light into light having a color complementary to blue and red, for instance into green and/or yellow light. Further, the light conversion layer is configured to transmit part of the light source light, i.e. at least part of the blue light and part of the red light. In this way, white lighting unit light may be obtained. In this embodiment, the first luminescent material comprises one or more materials that are able to convert the light source light into red light and into blue light, which again leads to a light source which provides pink light source light. As blue component, for instance the well-known material $BaMgAl_{10}O_{17}:Eu^{2+}$ might be applied, and as red component the elsewhere herein indicated red luminescent material(s) may be applied. In principle, one single luminescent material might be able to convert the UV light into blue and red light (for instance $Eu^{2+}$,$Mn^{2+}$ codoped systems), but in general two or more different luminescent materials may be applied.

Preferably, the light source is a light source that during operation emits at least light at a wavelength selected from the range of 200-490 nm, especially a light source that during operation emits at least light at wavelength selected from the range of 400-490 nm, even more especially in the range of 440-490 nm, like selected from the range of 470-485 nm. This light may partially be used by the luminescent material(s) (see below). In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-530 nm. The terms "yellow light" or "yellow emission" especially relate to light having a wavelength in the range of about 530-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

In a specific embodiment, the complementary color component of the second luminescent material light is selected from the group consisting of a yellow component and a green component. Hence, the second luminescent material may be a material configured to generate yellow light upon excitation with the blue (or UV) light and/or the second luminescent material may be a material configured to generate green light upon excitation with the blue (or UV) light. The choice for green and/or yellow may also depend upon the desired color rendering (CRI or R8 or Ra).

The term "luminescent material" may also relate to a plurality of different luminescent materials. The term luminescent material herein especially relates to inorganic luminescent materials, which are also sometimes indicated as luminescent materials. These terms are known to the person skilled in the art.

In a further specific embodiment, the first luminescent material comprises one or more luminescent materials selected from the group consisting of divalent europium containing nitride luminescent material or a divalent europium containing oxynitride luminescent material.

The red luminescent material may in an embodiment comprise one or more materials selected from the group consisting of $(Ba,Sr,Ca)S:Eu$, $(Ba,Sr,Ca)AlSiN_3:Eu$ and $(Ba,Sr,Ca)_2Si_5N_8:Eu$. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":$Eu^{2+}$", indicates that part of the metal ions is replaced by Eu (in these examples by $Eu^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba. The material $(Ba,Sr,Ca)S:Eu$ can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba_5Sr_5Ca)_2Si_5N_8:Eu$ can also be indicated as $M_2Si_5N_8:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as Ba1.5Sr0.5Si5N8:Eu, (i.e. 75% Ba; 25% Sr). Here, Eu is introduced and replaces at least part of M i.e. one or more of Ba, Sr, and Ca). Likewise, the material $(Ba_5Sr_5Ca)AlSiN_3:Eu$ can also be indicated as $MAlSiN_3:Eu_5$ wherein M is one or more elements selected from the group consisting of barium (Ba) strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Preferably, in an embodiment the first luminescent material comprises $(Ca,Sr,Ba)AlSiN_3:Eu$, preferably $CaAlSiN_3:Eu$. Further, in another embodiment, which may be combined with the former, the first luminescent material comprises $(Ca,Sr,Ba)_2Si_5N_8:Eu$, preferably $(Sr,Ba)_2Si_5N_8:Eu$. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc.

Hence, in an embodiment the first luminescent material comprises $M_2Si_5N_8:Eu^{2+}$, wherein M is selected from the group consisting of Ca, Sr and Ba, even more especially wherein M is selected from the group consisting of Sr and Ba. In yet another embodiment, which may be combined with the former, the first luminescent material comprises $MAlN_3:Eu^{2+}$, wherein M is selected from the group consisting of Ca, Sr and Ba, even more especially wherein M is selected from the group consisting of Sr and Ba.

Concerning the second luminescent material, which is comprised by the light conversion layer, remote from the light source, the second luminescent material comprises one or more luminescent materials selected from the group consisting of a trivalent cerium containing garnet and a trivalent cerium containing oxynitride (and optionally a divalent europium containing (oxy-)nitride).

Especially, the second luminescent material comprises a $M_3A_5O_{12}:Ce^{3+}$ luminescent material, wherein M is selected from the group consisting of Sc, Y, Tb, Gd, and Lu, wherein A is selected from the group consisting of Al and Ga. Preferably, M at least comprises one or more of Y and Lu, and A at least comprises Al. These types of materials may give highest efficiencies at the desired color rendering index values. In a specific embodiment, the second luminescent material comprises at least two luminescent materials of the type of $M_3A_5O_{12}:Ce^{3+}$, wherein M is selected from the group consisting of Y and Lu, wherein A is selected from the group consisting of Al, and wherein the ratio Y:Lu differ for the at least two luminescent materials. For instance, one of them may be purely based on Y, such as $Y_3Al_5O_{12}:Ce^{3+}$, and one of them may be a Y,Lu based system, such as $(Y_{0.5}Lu_{0.5})_3Al_5O_{12}:Ce^{3+}$.

Embodiments of garnets especially include $M_3A_5O_{12}$ garnets, wherein M comprises at least yttrium or lutetium and wherein A comprises at least aluminium. Such garnet may be doped with cerium (Ce), with praseodymium (Pr) or a combination of cerium and praseodymium; especially however with Ce. Especially, A comprises aluminium (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3Al_5O_{12}:Ce$, wherein x is equal to or larger than 0 and equal to or smaller than 1. The term ":Ce" or ":Ce$^{3+}$", indicates that part of the metal ions (i.e. in the garnets: part of the "M" ions) in the luminescent material is replaced by Ce. For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

As will be clear to the person skilled in the art, also combinations of first luminescent materials may be applied. Likewise, also combinations of second luminescent material may be applied. Further, as will be clear to the person skilled in the art, optimization of the luminescent material(s) with respect to one or more of constituting elements, activator concentration, particle size, etc. or optimization with respect to luminescent material combination(s), may be applied to optimize the lighting unit.

In specific embodiments, with especially high efficiencies and good color rendering, the light emitting diode is configured to generate LED light with a blue component, wherein the first luminescent material comprises one or more of $M_2Si_5N_8:Eu^{2+}$ and $MAlN_3:Eu^{2+}$, wherein M is selected from the group consisting of Sr and Ba, wherein the second luminescent material comprises at least two luminescent materials of the type of $M_3A_5O_{12}:Ce^{3+}$, wherein M is selected from the group consisting of Y and Lu, wherein A is selected from the group consisting of Al (i.e. is Al), and wherein the ratio Y:Lu differ for the at least two luminescent materials.

As indicated above, there is a non-zero distance between the light source (i.e. including the first luminescent material layer) and the light conversion layer. The space between light source and light conversion layer can be filled with any material that does not substantially absorb light from the light source and the conversion layer. Examples for filling materials are: air, vacuum, gases like one or more of $N_2$, $O_2$, Ar, etc., silicone, water or other liquids. In an embodiment, the distance (d) between the light source and the light conversion layer is in the range of 50 µm to 20 mm. Especially, the distance (d) between the light source and the light conversion layer is at least 0.5 times a width of the light emitting surface. In general, LED dies, as specific example of light emitting surfaces, are square. In a case a non square light emitting surface would be applied, the effective width may be used. The effective width can be defined as the square root of the area of the light emitting surface. Especially good results are obtained when the distance is at least 200 µm, even more preferably at least 500 µm, such as especially at least 600 µm.

Especially, the light conversion layer is at least partially transmissive for the light source light. This implies that the transmission of the light transmissive layer is such, that the blue component and the red component are both at least partially transmitted. Hence, downstream of the light conversion layer, blue light can be observed that directly originates from the light source; likewise, red light can be observed that directly originates from the light source. These are the blue and red components of the lighting unit light. Especially, the red component light does not excite secondary emission in the conversion layer. In an embodiment, conversion layer light is only generated from absorption of blue components of the lighting unit light.

In an embodiment, the lighting unit comprises a plurality of light sources, each configured to generate light source light having the blue component and having the red component of the luminescent material light. Hence, in this embodiment, all light sources generate pink light.

The light source may be configured in a chamber, with reflective wall(s) (such as coated with $TiO_2$), and a transparent window. In an embodiment, the window is the light conversion layer. In yet a further embodiment, the window comprises the light conversion layer. This layer may be arranged upstream of the window or downstream of the window. In yet a further embodiment, light conversion layers are applied at both sides of the window.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices or apparatus herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to an apparatus or device comprising one or more of the characterizing features described in the description and/or shown in the attached drawings. The invention further pertains to a method or process comprising one or more of the characterising features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 1a-1b schematically depict some embodiments of the lighting unit;

FIGS. 2a-2d schematically depict some aspects of the lighting unit; and

Figure 3A:
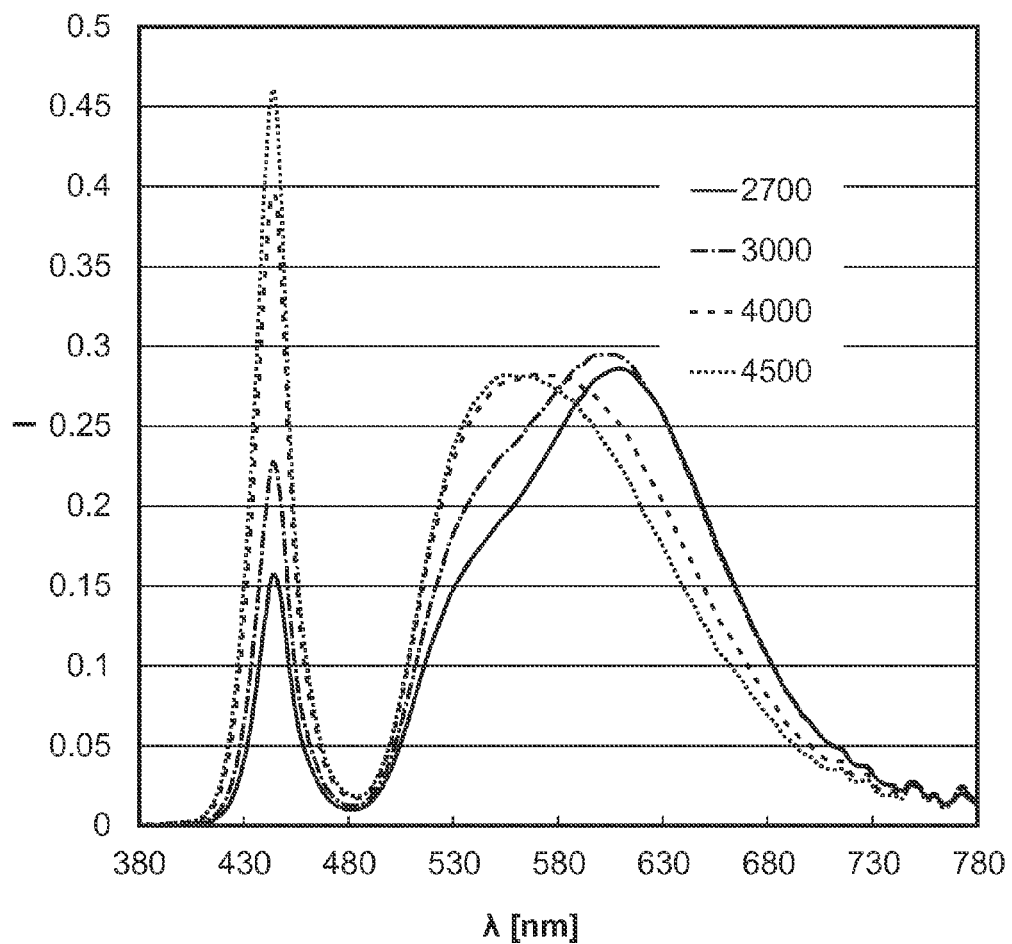
FIGS. 3a-3b show emission spectra of some examples of the lighting unit.

The drawings are not necessarily on scale

DETAILED DESCRIPTION OF THE EMBODIMENTS

FIGS. 1a-1b schematically depict embodiments of a lighting unit 100 as described herein. The lighting unit 100 comprises a light source 10 and a light conversion layer 20, which is configured at a non-zero distance (d) from the light source 10. The light source 10 comprises (in this schematically depicted embodiment) a light emitting diode (LED) 110 and a first luminescent material layer 120 (comprising first luminescent material 130), which is in physical contact with a light emitting surface 115 (the LED die) of the light emitting diode 110.

The light source 10 is configured to generate light source light 11 having a blue component and having a red component (see also the comments on FIGS. 2a-2c).

The (remote) light conversion layer 20 comprises a second luminescent material 30 configured to convert at least part of the light source light 11 into second luminescent material light 31.

In a specific embodiment, all surfaces within the lighting unit, apart from the luminescent material layer(s), are coated with a reflective coating of for instance $TiO_2$ particles.

The light source light 11 and the second luminescent material light 31 together form downstream of the light conversion layer 20 lighting unit light 111, which is especially white. Hence, the lighting unit 100 may in an embodiment be configured to provide white lighting unit light 111 having a blue and a red component of the light source light 11 (see also below) and having a complementary color component of the second luminescent material light 31. The second luminescent material 30 may especially comprise a luminescent material configured to generate green and/or yellow light upon excitation with the light source light 11.

FIG. 1b schematically depicts an embodiment wherein a plurality of light sources 10 are applied, especially with each light source 10 configured to generate pink light source light 11.

FIGS. 1a-1b schematically depict embodiments wherein the lighting unit comprises a cavity 5, which encloses the light source(s) 10, or at least the (their) light emitting surface(s) 115. Further, the light conversion layer may be part of an exit window, or may be an exit window itself. Here, the exit window comprises the light conversion layer. In an embodiment, this may be a transmissive ceramic material. In yet another embodiment, the luminescent material is enclosed in a foil, which may for instance be arranged downstream upstream of the exit window. As indicated above, in an embodiment all surfaces within the cavity 5, apart from the luminescent material layer(s), are coated with a reflective coating of for instance $TiO_2$ particles. For instance, except for the exit window, all surfaces of the cavity may be coated with a reflective material. Note that in FIGS. 1a-1b the first luminescent material layer 120 is configured downstream of the light source, but configured upstream of the light conversion layer 20; the light conversion layer 20 is configured downstream of the first luminescent material layer.

FIGS. 2a-2c schematically depict in more detail the light source 10. The light source 10 in general comprises a light emitting device (LED), having a light emitting surface or die 115 (FIG. 2a). On top of the light emitting surface 115, a first luminescent material layer 120 is arranged. For the sake of understanding, in FIG. 2b this first luminescent material layer 120 is drawn at a distance. In this way, the light rays can better be seen. The light emitting diode 110 is configured to generate LED light 111. This can be blue light and/or UV light, but especially comprises at least blue light. The first luminescent material layer 120 comprises first luminescent material 130, configured to convert at least part of the LED light 111 into luminescent material light 131 having a red component. In this way, the light source 10 is configured to generate light source light 11 having a blue component (in general blue LED light) and having the red component of the luminescent material light 111. In principle, however, the LED light may also be UV light, and the first luminescent material layer may convert at least part thereof into blue light (blue component) and red light (red component). FIG. 2c schematically depicts the integral light source 10, as also schematically depicted in FIGS. 1a-1b (i.e. with physical contact between the light exit surface 115 and the first luminescent material layer 120). FIG. 2d very schematically depicts a top view of the light emitting diode 110, with light emitting surface 115, having width (and length) w.

In a specific embodiment, the light emitting diode 110 is configured to generate LED light 111 with a blue component, and the first luminescent material 130 comprises one or more of $M_2Si_5N_8$:$Eu^{2+}$ and $MAlN_3$:$Eu^{2+}$, wherein M is selected from the group consisting of Sr and Ba, the second luminescent material 30 comprises at least two luminescent materials of the type of $M_3A_5O_{12}$:$Ce^{3+}$, wherein M is selected from the group consisting of Y and Lu, A is selected from the group consisting of Al, and wherein the ratio Y:Lu differ for the at least two luminescent materials.

EXAMPLES

A number of configurations were investigated. In the below tables, the color temperatures (CCT), conversion efficiency (CE), lumen equivalent (LE), and color rendering index (CRI/Ra) are displayed for different configurations of luminescent materials. These data relate to the lighting unit light 101. The different color temperatures are obtained by varying the relative amounts of luminescent materials and/or varying layer thicknesses. The red phosphors (luminescent materials), are always comprised in the first luminescent material layer and the green phosphor(s) are always comprised in the remote light conversion layer (except for the last table; see comments below). The distance of the remote light conversion layer to the light source 10 is indicated in each table.

| CCT[K] | CE [lm/W] | LE [lm/W] | Ra |
|---|---|---|---|
| 2700 | 177 | 319 | 76 |
| 3000 | 189 | 325 | 75 |
| 4000 | 200 | 331 | 70 |
| 4500 | 200 | 330 | 68 |

Distance to pink LED 600 μm
Red phosphor (Sr,Ca)AlN3:Eu
Green phosphor Y(2.94)Ce0.006Al5O12

The emission spectra (i.e. of the lighting unit light 101) belonging to the devices with above four different color temperatures are displayed in FIG. 3a.

| CCT[K] | CE [lm/W] | LE [lm/W] | Ra |
|---|---|---|---|
| 2700 | 168 | 312 | 82 |
| 3000 | 181 | 318 | 81 |
| 4000 | 196 | 322 | 77 |
| 4500 | 197 | 320 | 75 |

Distance to pink LED 600 μm
Red phosphor (Sr,Ca)AlN3:Eu
Green phosphor I (70 vol-%) Y(2.94)Ce0.006Al5O12
Green phosphor II (30 vol-%) Lu(2.97)Ce0.003Al5O12

| CCT[K] | CE [lm/W] | LE [lm/W] | Ra |
|---|---|---|---|
| 2700 | 160 | 313 | 81 |
| 3000 | 165 | 318 | 80 |
| 4000 | 165 | 322 | 77 |
| 4500 | 163 | 320 | 75 |

Distance to pink LED 200 μm
Red phosphor (Sr,Ca)AlN3:Eu
Green phosphor I (70 vol-%) Y(2.94)Ce0.006Al5O12
Green phosphor II (30 vol-%) Lu(2.97)Ce0.003Al5O12

| CCT[K] | CE [lm/W] | LE [lm/W] | Ra |
|---|---|---|---|
| 2700 | 204 | 328 | 78 |
| 3000 | 211 | 330 | 80 |
| 4000 | 219 | 326 | 82 |
| 4500 | 218 | 322 | 82 |

Distance to pink LED 600 μm
Red phosphor BaSrSi5N8:Eu(2%)
Green phosphor I (70 vol-%) Y(2.94)Ce0.006Al5O12
Green phosphor II (30 vol-%) Lu(2.97)Ce0.003Al5O12

Figure 3B:
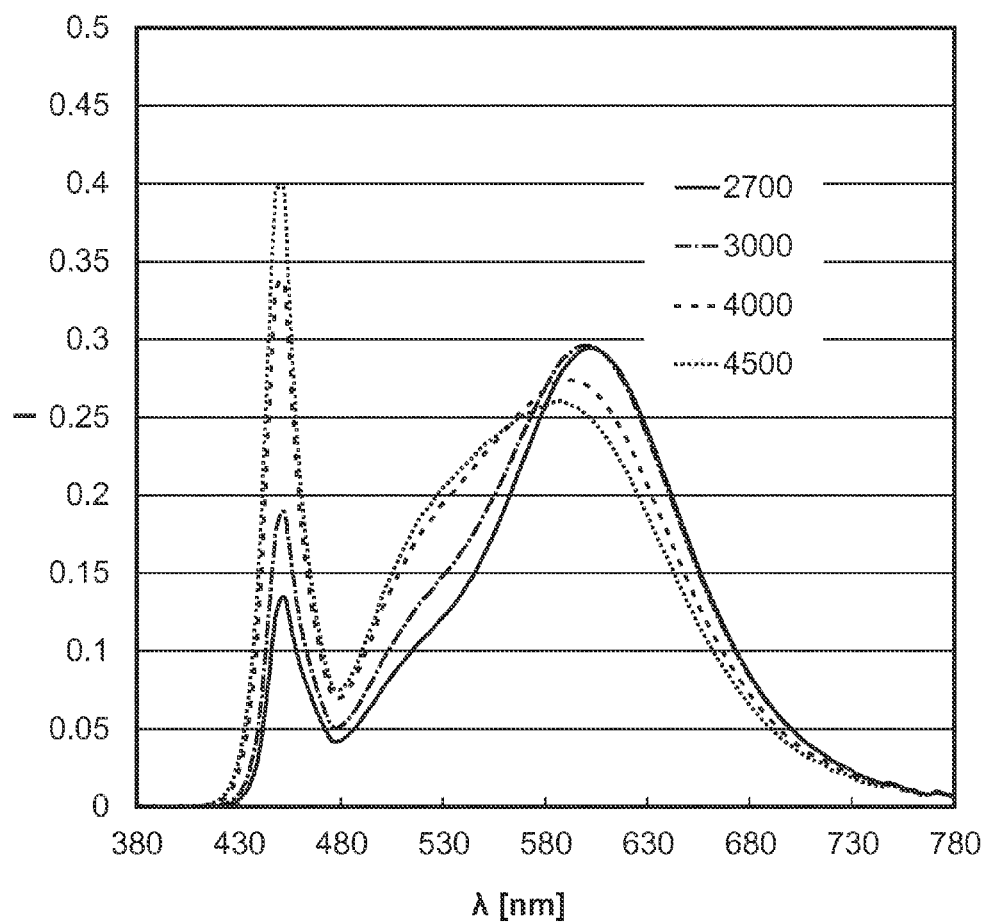

The emission spectra (i.e. of the lighting unit light 101) belonging to the devices with above four different color temperatures are displayed in FIG. 3b.

| CCT[K] | CE [lm/W] | LE [lm/W] | Ra |
|---|---|---|---|
| 2700 | 191 | 323 | 81 |
| 3000 | 201 | 326 | 82 |
| 4000 | 212 | 325 | 81 |
| 4500 | 213 | 322 | 81 |

Distance to pink LED 600 μm
Red phosphor Ba0.8Sr1.2Si5N8:Eu(4%)
Green phosphor I (50 vol-%) Y(2.94)Ce0.006Al5O12
Green phosphor II (50 vol-%) Lu(2.97)Ce0.003Al5O12

| CCT[K] | CE [lm/W] | LE [lm/W] | Ra |
|---|---|---|---|
| 2700 | 147 | 326 | 79 |
| 3000 | 150 | 328 | 80 |
| 4000 | 155 | 325 | 80 |
| 4500 | 160 | 322 | 80 |

Distance to pink LED 0 μm
Red phosphor Ba0.8Sr1.2Si5N8:Eu(4%)
Green phosphor I (50 vol-%) Y(2.94)Ce0.006Al5O12
Green phosphor II (50 vol-%) Lu(2.97)Ce0.003Al5O12

In this last table, the light conversion layer is in physical contact with the first luminescent material layer. As can be seen, the efficiency is substantially lower than of the above examples.

Further, also a mixture of the first luminescent material and the second luminescent material was evaluated. In this case the color rendering index was lower than of a non-mixed system but with zero distance, and substantially lower than in a non-mixed system with non-zero distance. For the specific luminescent material combination chosen, the color rendering index values were 90.7 (510 μm distance), 88.4 (0 μm distance) and 85.9 (mixed system).

As can be derived from the above data, choosing a non-zero distance for the green (or green/yellow) luminescent material(s) give a better efficiency than when the luminescent materials are all on the die (last table). However, it also surprisingly appeared that when the green luminescent material was arranged on the die and the red luminescent material was arranged remote, the efficiency was lower and/or the color rendering was lower, see the table below (which is based on YAG:Ce on the LED and CaAlN3:Eu arranged remote; this example compares to the example in the first table; but with another configuration of the luminescent materials):

| CCT[K] | CE [lm/W] | LE [lm/W] | Ra |
|---|---|---|---|
| 2700 | 152 | 328 | 70 |
| 3000 | 167 | 333 | 70 |
| 4000 | 180 | 333 | 70 |
| 4500 | 190 | 331 | 70 |

As can be seen, the efficiency is lower, and the color rendering index is substantially lower. Further, luminescent material use in such configuration(s) appeared to be less efficient.

The invention claimed is:

1. A lighting unit comprising a light source and a light conversion layer, wherein
the light source comprises a light emitting diode and a first luminescent material layer in physical contact with a light emitting surface of the light emitting diode, wherein the light emitting diode is configured to generate LED light, wherein the first luminescent material layer comprises a first luminescent material, configured to convert at least part of the LED light into luminescent material light having a red component, and wherein the light source is configured to generate light source light having a blue component and having the red component of the luminescent material light;
the light conversion layer comprises a second luminescent material configured to convert at least part of the light source light into second luminescent material light, wherein the light conversion layer is configured at a non-zero distance (d) from the light source;
wherein the second luminescent material comprises at least two luminescent materials of the type of $M_3A_5O_{12}$:$Ce^{3+}$, wherein M is selected from the group consisting of Y and Lu, wherein A is selected from the group consisting of Al, and wherein the ratio Y:Lu differ for the at least two luminescent materials; and
wherein the lighting unit is configured to provide white lighting unit light having the blue and the red component of the light source light and having a complementary color component of the second luminescent material light.

2. The lighting unit according to claim 1, wherein the light emitting diode is configured to generate LED light with a blue component.

3. The lighting unit according to claim 2, wherein the light emitting diode is configured to generate LED light with a UV component, and wherein the first luminescent material is configured to convert at least part of the LED light into luminescent material light additionally having a blue component.

4. The lighting unit according to claim 3, wherein the complementary color component of the second luminescent material light is selected from the group consisting of a yellow component and a green component.

5. The lighting unit according to claim 4, wherein the first luminescent material comprises one or more luminescent materials selected from the group consisting of divalent europium containing nitride luminescent material, a divalent europium containing oxynitride luminescent material.

6. The lighting unit according to claim 5, wherein the first luminescent material comprises $M_2Si_5N_8$:$Eu^{2+}$, wherein M is selected from the group consisting of Ca, Sr and Ba.

7. The lighting unit according to claim 6, wherein M is selected from the group consisting of Sr and Ba.

8. The lighting unit according to claim 7, wherein the first luminescent material comprises $MAlN_3$:$Eu^{2+}$, wherein M is selected from the group consisting of Ca, Sr and Ba.

9. The lighting unit according to claim 8, wherein the second luminescent material comprises one or more luminescent materials selected from the group consisting of a trivalent cerium containing garnet and a trivalent cerium containing oxynitride and a divalent europium oxynitride.

10. The lighting unit according to claim 9, wherein the second luminescent material comprises an $M_3A_5O_{12}$:$Ce^{3+}$ luminescent material, wherein M is selected from the group consisting of Sc, Y, Tb, Gd, and Lu, wherein A is selected from the group consisting of Al and Ga.

11. The lighting unit according to claim 10, wherein M at least comprises one or more of Y and Lu, and wherein A at least comprises Al.

12. The lighting unit according to claim 11, wherein the light emitting diode is configured to generate LED light with a blue component, wherein the first luminescent material comprises one or more of $M_2Si_5N_8$:$Eu^{2+}$ and $MAlN_3$:$Eu^{2+}$, wherein M is selected from the group consisting of Sr and Ba.

13. The lighting unit according to claim 12, wherein the distance (d) between the light source and the light conversion layer is in the range of 50 μm to 20 mm.

14. The lighting unit according to claim 13, wherein the distance (d) between the light source and the light conversion layer is at least 0.5 times a width of the light emitting surface.

15. The lighting unit according to claim 14, comprising a plurality of light sources, each configured to generate light source light having the blue component and having the red component of the luminescent material light.

* * * * *